(12) United States Patent
Kay et al.

(10) Patent No.: US 6,208,375 B1
(45) Date of Patent: Mar. 27, 2001

(54) TEST PROBE POSITIONING METHOD AND SYSTEM FOR MICRO-SIZED DEVICES

(75) Inventors: Robert L. Kay, Thousand Oaks; Steven T. Lane, Camarillo, both of CA (US)

(73) Assignee: Elite Engineering Corporation, Newbury Park, CA (US)

( * ) Notice: Subject to any disclaimer, the term of this patent is extended or adjusted under 35 U.S.C. 154(b) by 0 days.

(21) Appl. No.: 09/316,709

(22) Filed: May 21, 1999

(51) Int. Cl.[7] ............................... H04N 7/18; G06K 9/00
(52) U.S. Cl. ............................... 348/95; 382/151
(58) Field of Search .................... 348/87, 94, 95, 348/92, 125, 133, 126, 134, 129; 382/151, 152, 141, 146, 8, 30, 209, 218; H04N 7/18; G06K 9/00

(56) References Cited

U.S. PATENT DOCUMENTS

| 5,530,374 | | 6/1996 | Yamaguchi | 324/758 |
| 5,539,676 | | 7/1996 | Yamaguchi | 364/559 |
| 5,585,738 | * | 12/1996 | Kuji et al. | 324/754 |
| 5,631,565 | * | 5/1997 | Winter | 324/511 |
| 5,696,837 | * | 12/1997 | Green | 382/128 |
| 5,869,975 | * | 2/1999 | Strid et al. | 324/754 |
| 5,916,715 | * | 6/1999 | Fulford, Jr. et al. | 430/22 |
| 6,089,107 | * | 7/2000 | Canella et al. | 73/865.8 |
| 6,118,894 | * | 9/2000 | Schwartz et al. | 382/151 |

* cited by examiner

*Primary Examiner*—Chris Kelley
*Assistant Examiner*—Tung Vo
(74) *Attorney, Agent, or Firm*—Koppel & Jacobs

(57) ABSTRACT

A test probe positioning method and system displays an image of a micro-device to be probed on a display screen. A "target feature" is selected—either by manual means such as a computer mouse, or by automatic means based on previously-stored information. The pixel address of the selected target feature within the displayed image is determined. A test probe is introduced into the field of view of the image, and its pixel address determined. With target and probe addresses known, the probe is moved to bring it into contact with the target feature. An individual probe is identified from among a plurality of probes by means of coded markings applied to each. The markings are a known distance apart and a known distance from the probe tip. When placed within the field of view, the identity of each probe, and its location relative to the camera, can be determined by observing its pattern of markings. The test probes are independently movable, so that any individual probe can be identified, located, and moved as necessary to contact a selected target feature. A routing network is used to convey a parameter between a selected test probe and an appropriate piece of test equipment.

52 Claims, 5 Drawing Sheets

TEST PROBE POSITIONING METHOD AND SYSTEM FOR MICRO-SIZED DEVICES

BACKGROUND OF THE INVENTION

1. Field of the Invention

This invention relates to the field of probe positioning methods and systems, and particularly to methods and systems used to locate test probes on micro-sized devices.

2. Description of the Related Art

The testing of "micro-sized" devices, i.e., integrated circuits (ICs) and micro-electromechanical (MEM) devices, prior to their assembly into closed packages, requires the use of one or more very small test probes. For an IC, the test probes are used to sense or apply electronic parameters, while a MEM device may require the testing of parameters that are, for example, mechanical, fluidic, pneumatic, or acoustic in nature.

Many test probe systems have been developed, primarily for use with ICs. One such system, typical of those in the field, is described in U.S. Pat. No. 5,539,676 to Yamaguchi, which is directed to a system for probing semiconductor wafers. A probe card holds a fixed array of probes, and the wafer is mounted on a movable table. The positions of the probes are known relative to a point on the card, and this information is stored in a memory device. A camera is moved so that a reference probe is aligned with a reference point in the view field of the camera. A processor uses the camera position information to determine the absolute coordinates of the reference probe, from which the positions of each of the other probes can be calculated. All of the test probes on the probe card are simultaneously brought into contact with the wafer to be tested. There is no means by which an individual feature on the wafer can be targeted for probing, nor of uniquely identifying an individual probe from among the probe card's array of probes.

Another Yamaguchi patent (U.S. Pat. No. 5,530,374) discloses a similar system, except that the camera is aligned with a reference marker on the probe card rather than a reference probe, with the positions of the probes known with respect to the marker. However, the limitations found in the previous system are present here as well.

The Yamaguchi systems work well when a number of identical wafers are to be tested in succession, and the array of points to be probed does not vary from wafer to wafer. However, these systems are not well-suited for use with small numbers of highly unique devices, such as MEM devices. Here, different probe types may be needed to accommodate the different parameter types that might be found on a MEM device. Furthermore, due to the interdisciplinary nature of a MEM device, which may combine mechanical, electric, and fluidic aspects, for example, it is likely to have a much more irregular surface than that of an typical IC wafer. Conventional high volume probe card-based test probe systems are unable to provide the kind of flexibility called for in this type of application.

SUMMARY OF THE INVENTION

A test probe positioning method and system are presented which overcome the limitations noted above, by providing the ability to identify and precisely locate individual probes from among a plurality of probes, and of independently moving a selected probe to a selected target feature.

The novel method is practiced by displaying an image of a micro-device to be probed on a display screen. A "target feature", i.e., a specific location on the device which is to be probed, is selected—either by manual means such as a computer mouse, or by automatic means, in which, for example, search and recognition software select a target feature based on previously-stored information. The pixel address of the selected target feature within the displayed image is determined. A test probe is introduced into the field of view of the image, and a means is provided whereby the pixel address of the test probe within the displayed image is determined. With the target and probe addresses known, the probe is moved to bring it into contact with the target feature.

An individual probe is identified from among a plurality of probes by means of coded markings applied to each. In a preferred embodiment, the pattern of markings on each probe is unique. The markings are a known distance apart and from the probe tip. When placed within the field of view, the identity of each probe can be determined by observing its coded pattern of markings. Furthermore, by knowing the actual spacing between markings and probe tip, combined with knowledge of the camera position and the angle of the probes with respect to the camera, the position of the probe tip can be determined relative to the camera in three dimensions. In this way, an individual probe can be identified, precisely located, and then moved as necessary to contact the selected target feature. This capability, in combination with a routing network interposed between the probes and the external test equipment used to apply stimuli to and receive data from the various probes, enables any one of a system's probes to be connected to an appropriate piece of test equipment.

Further features and advantages of the invention will be apparent to those skilled in the art from the following detailed description, taken together with the accompanying drawings.

DETAILED DESCRIPTION OF THE INVENTION

Figure 1:
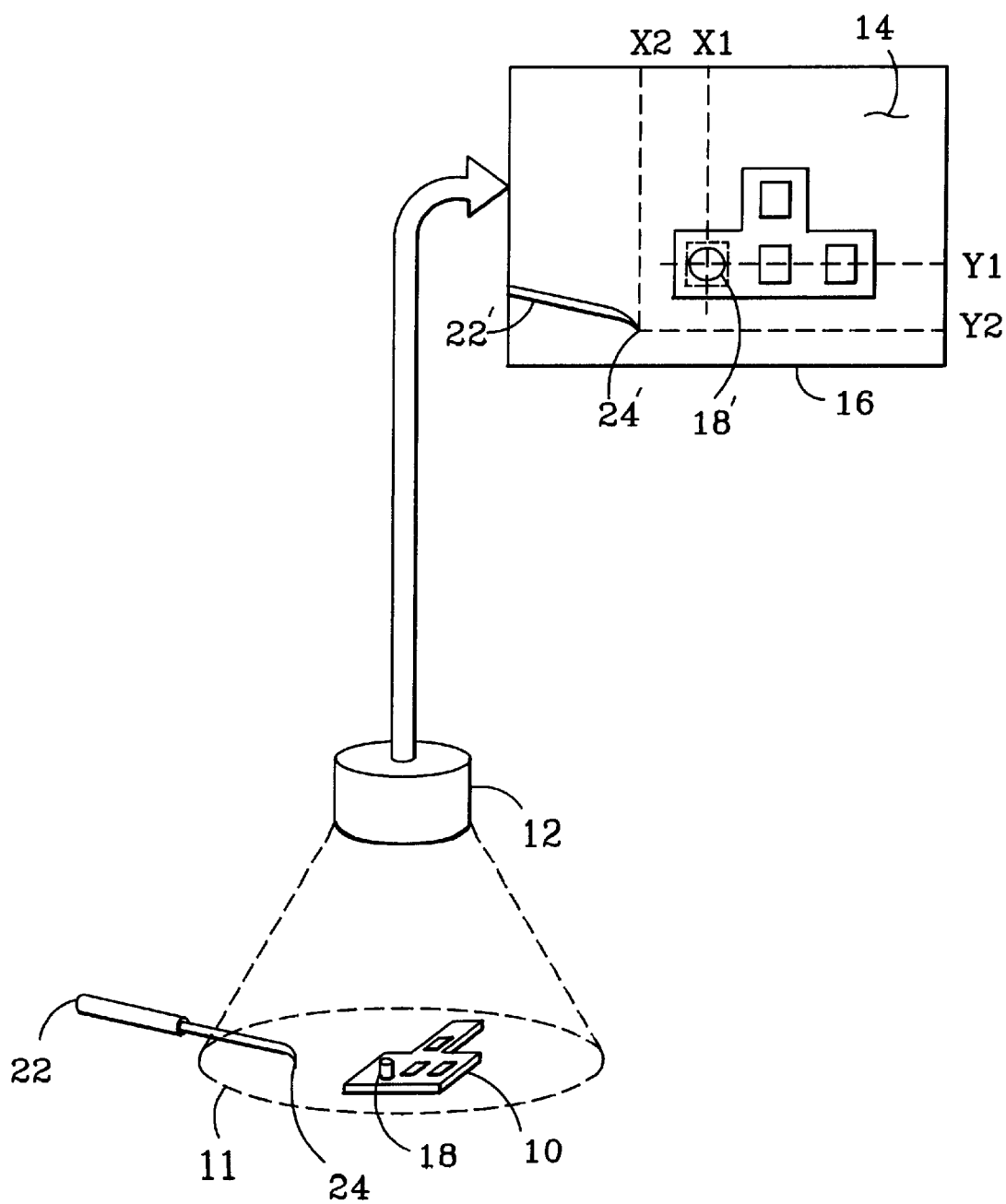
FIG. 1 is a diagram illustrating the basic principles of the present invention.

The basic principles of the invention are illustrated in FIG. 1. A micro-sized device 10, shown in FIG. 1 as a MEM device, is placed within the field of view 11 of an imaging device 12, which outputs an image 14 that is displayed on a display screen 16. The image may be manipulated, i.e., rotated, filtered, etc., as needed to provide a clear image in a desired orientation. The display screen is made up of a large number of pixels, each of which has an associated "pixel address" given by its X and Y coordinates within the displayed image.

A target feature 18 on micro-sized device 10 is selected to be contacted with a test probe, for the purpose of either applying a stimulus to, or sensing a parameter from, the device. The target feature is selected by reference to image 14, which includes a rendering of target feature 18; this displayed version of target feature 18 is identified in FIG. 1 as 18'. Once selected, the pixel address of target feature 18' is determined, identified in FIG. 1 as "X1,Y1" and referred to herein as the "target address".

A test probe 22 having a probe tip 24 is introduced into field of view 11, where it is picked up by imaging device 12 and appears within image 14 as test probe 22' with tip 24'. Once in the field of view, the pixel address of probe tip 24' is determined, identified in FIG. 1 as "X2,Y2" and referred to herein as the "probe address". With the pixel addresses of the target feature and the probe tip known, the probe 22 is moved as needed to cause tip 24 to contact target feature 18.

The invention is suitable for use with either ICs or MEM devices. A variety of parameter types, including, for example, electronic, mechanical, fluidic, acoustic, and/or pneumatic parameters, may be involved when testing a MEM device. As such, the testing of a MEM device may require a variety of different probe types that are specifically designed for a particular parameter-type. Because the invention enables an individual test probe to be independently moved and its position precisely determined, it is particularly well-suited to the demands imposed by MEM devices.

Figure 2:
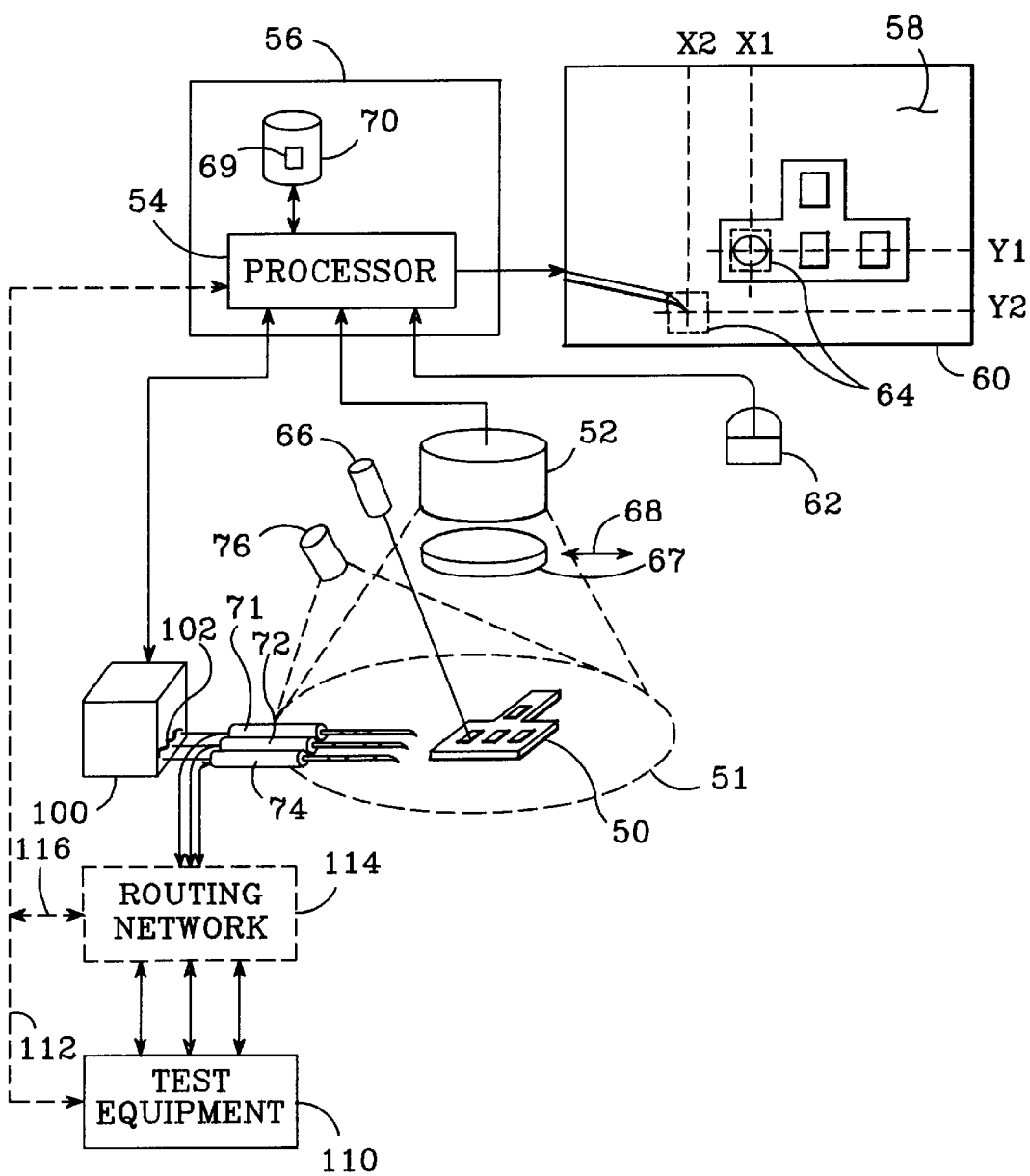
FIG. 2 is a more-detailed diagram of the present invention with several of its preferred implementation details.

A more-detailed embodiment of the present invention is shown in FIG. 2. Here, an IC 50 is within the field of view 51 of an imaging device 52. The output of the imaging device is fed to a processor 54, preferably that contained within a personal computer (PC) 56, which processes the output and generates the data necessary to form an image 58 on a display screen 60.

The invention can be configured to operate in a largely manual mode, which requires an operator to direct the selection of a target feature and a test probe, or in a largely automatic mode, in which one or more target features and test probes are automatically identified and the features probed without need of an operator. When in manual mode, as might be used when testing a prototype or low-volume device, for example, a target feature is preferably selected using a movable location indicator such as a cursor arrow or reticle box. Processor 54 is preferably programmed to generate an indicator 64 within image 58, which is moved about the image with, for example, a computer mouse 62. When the operator spots a feature to be probed within image 58, he moves indicator 64 on or near the feature, and clicks a mouse button to select the feature as the target feature. Processor 54 is further programmed to note the pixel address of the center of the indicator, and thus of the selected target feature, when the mouse button is clicked. In this way, the target address is determined.

As an alternative to the use of a movable location indicator, a target feature can be illuminated with a spot of laser light. A source of laser light 66 is manipulated so that its beam illuminates a particular target feature. By comparing the camera images with the beam on and the beam off, the laser spot can be readily recognized and its pixel address determined. If necessary, a movable location indicator is moved on or near the positioned laser spot to indicate the address of the illuminated target feature.

The use of a laser light source to illuminate a target feature is aided by the use of an optical filter 67 placed between the micro-sized device 50 and imaging device 52. The filter allows light having the wavelength of the laser beam to pass through to the camera, while blocking light of other wavelengths. This reduces the amount of visual clutter present in the displayed image, making it easier to recognize and locate the beam spot, and thus the target feature, within the image. Optical filter 67 is preferably made to be movable (as indicated by arrow 68), so that it may be employed and removed as needed. A number of other optical filters having different characteristics could also be used in this way, with each moved into position between device 50 and camera 52 as needed.

When in the manual operating mode, a test probe is preferably selected using computer mouse 62. A user selects a test probe by clicking on or near it, using a movable location indicator such as indicator 64, for example. Once selected, the probe positioning system determines the pixel address of the selected probe's tip by a means described below.

In the automatic operating mode, which might be used when testing a large number of identical devices, for example, characteristics of the various target features to be probed on a given type of device are entered into a database 69 which resides in a memory device 70 accessible to processor 54. For example, database 69 may contain information about the shape and relative location of each of a device's target features. When a new micro-sized device 50 is placed within the field of view 51 of camera 52, the processor 54 is programmed to execute search and recognition software which uses the information in database 69 to identify and precisely locate the pixel addresses for each of the target features to be probed.

Similarly, in automatic mode, the probe positioning system automatically handles the selection of a test probe to perform a given test. Information about the identity and function of each test probe is stored in a database or lookup table within memory device 70. Processor 54 is programmed to identify each of the probes within field of view 51 (by a means described below), and to select the identified probe which is best suited to contact the selected target feature.

A key aspect of the invention is its ability to identify a particular test probe from among a plurality of probes, and to accurately determine the position of the identified probe. There are a number of reasons why it is desirable to be able to uniquely identify each probe. It may be that each of the probes is designed to test a different parameter-type, in which case only certain probes can be used with certain target features. Alternatively, it might be desirable to probe a particular target feature with the test probe that is physically closest to the feature. In this case, it is necessary to be able to identify the closest probe, so that the parameter being applied or sensed can be routed to or from the appropriate probe; such routing might be handled by a routing network connected between the various probes and the equipment which provides testing stimuli and/or receives the probed signals, and is discussed in detail below.

Figure 3A:
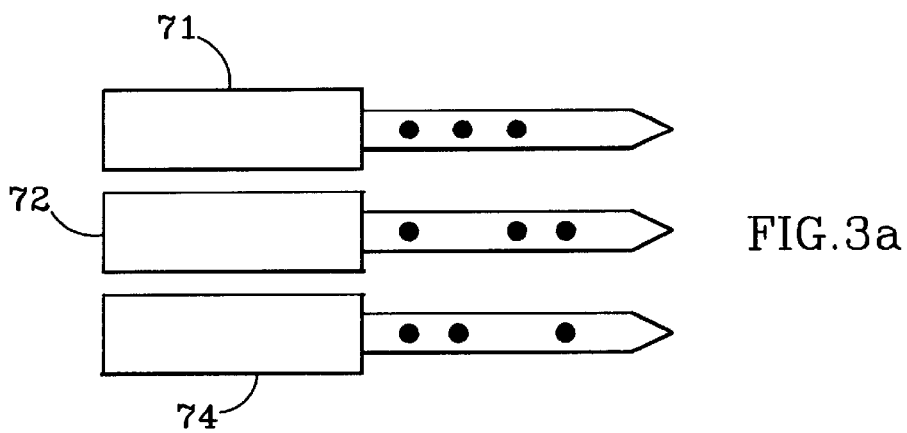
FIG. 3a is a plan view of a plurality of test probes which have been marked with unique coded markings per the present invention.

A probe positioning system's probes are made uniquely identifiable by applying coded markings to each of the test probes that may be within field of view 51. One such use of coding markings is shown in FIG. 2, in which three probes 71, 72 and 74 are within field of view 51. A unique pattern of stripes or dots is applied to each probe, preferably near their distal ends, with the patterns applied to respective probes known in advance. A plan view of the probes used in this illustrative example is shown in FIG. 3a. Each probe has three dots: probe 71's dots are spaced equidistantly, probe 72 has a gap between its first dot and its last two dots, and probe 74 has a gap between its first two dots and its last dot. Using a unique pattern of markings enables each probe to be definitively identified by simply observing the dot patterns in image 58 and comparing them with the known patterns. Note that while the dots are not shown as being in the plane of camera 52 in FIG. 2, in practice it is necessary that the patterns applied to the probes be visible to the camera.

One means by which a pattern of stripes or dots can be applied to the test probes is with the use of fluorescent paint, i.e., paint that fluoresces at particular wavelengths when illuminated. A light source 76 is used to illuminate the area within field of view 51 in which test probes may be present. Light source 76 may be laser or non-laser light, though laser light is preferred as it causes the patterns to fluoresce more intensely, making them easier to recognize. Also, because laser light is wavelength-specific, it could be used to cause just certain probes to fluoresce. For example, the patterns on those test probes which test fluidic parameters can be applied with a paint that fluoresces when excited by light at a first wavelength, while electronic test probes could use a paint that only fluoresces when illuminated by light at a second wavelength. This technique reduces the number of items appearing in image 58 that might otherwise distract the operator or the search and recognition software, making it easier to identify and locate an individual probe. One or more optical filters 67 could also be used to reduce the distractions present in image 58.

Note, however, that the invention is not limited to the use of fluorescent paint, nor of the use of laser light. Coded markings applied with conventional paint and illuminated with broad white light would also be visible in image 14, and thus useful to identify and locate individual probes.

Figure 3B:
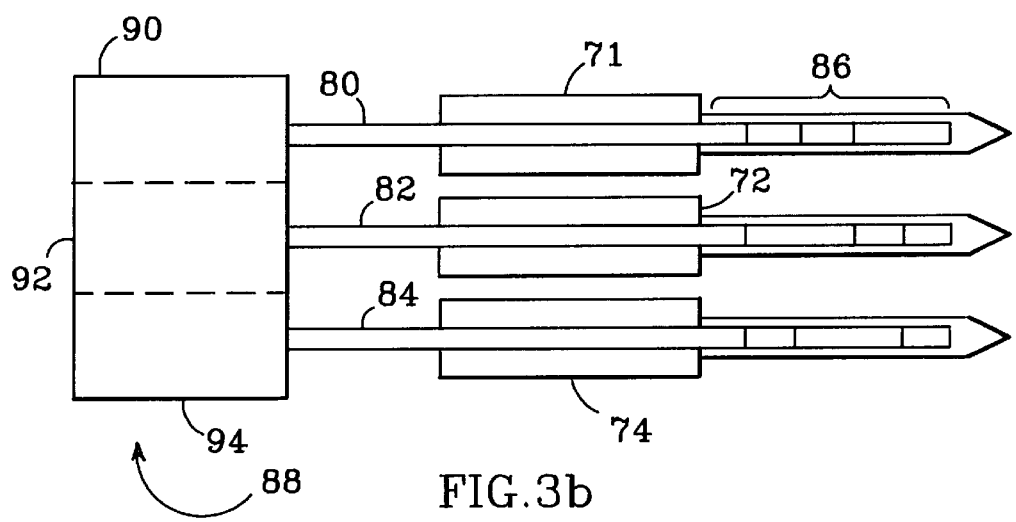
FIG. 3b is a plan view of a plurality of test probes to which scored optical fibers have been attached to provide unique coded markings per the present invention.

Another means by which coded markings can be applied to the test probes is with the use of scored optical fibers. This is illustrated in FIG. 3b. Optical fibers 80, 82 and 84 are piggy-backed onto respective test probes 71, 72 and 74. Each of the fibers is scored to change its optical properties in order to create points of light emission. The pattern of scoring marks 86 may be unique for each fiber, or alternatively, may be the same for each probe—if each optical fiber can be individually energized (as discussed below). The scoring marks serve the same purpose as did the pattern of stripes or dots discussed above, enabling each test probe to be individually identified and located. Each fiber is coupled to a source of optical energy, which is provided by a light source 88. Light source 88 is preferably a laser.

To aid in distinguishing one fiber-equipped test probe from another, one or more optical filters 67 may be employed which are tuned to block light that is outside of a particular frequency range. If all of the fibers on respective probes are to energized simultaneously, a single light source 88 may be employed, in which case the pattern of coded markings on each probe should be unique. Alternatively, light source 88 can be made up of a number of individual light sources 90, 92 and 94 coupled to respective fibers. Light sources 90, 92 and 94 can be arranged to generate light having respective unique wavelengths, to further enhance the ability to single out one probe from among many. This spectra discrimination can also be arranged so as to not be visible to the human eye, which reduces clutter in the image presented to the operator that might otherwise be distracting.

Another approach involving multiple light sources 90, 92 and 94 that enables the probes to be individually distinguished requires the ability to selectively energize each of the fibers. This enables the coded pattern to be the same on each probe, and, because only one fiber is emitting light at any given time, reduces the demands on the imaging system.

The coded markings used on the test probes serve two purposes. As discussed above, the markings on each probe permit an individual probe to be identified from among a plurality of probes. The markings also permit the location of an identified probe relative to the camera to be determined. This requires a minimum of three marks or points on each probe, precise advance knowledge of the spacing between the marks on each probe and between the marks and the probe tip, and advance knowledge of the angle between the probes and the center line of the camera's field of view (FOV).

Figure 4B:
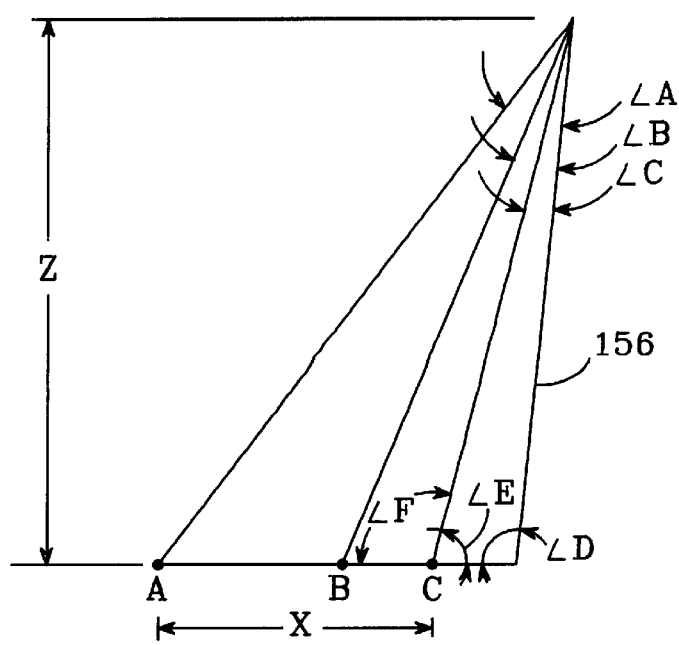
FIGS. 4a and 4b illustrate the use of coded markings to determine test probe identity and position.
Figure 4A:
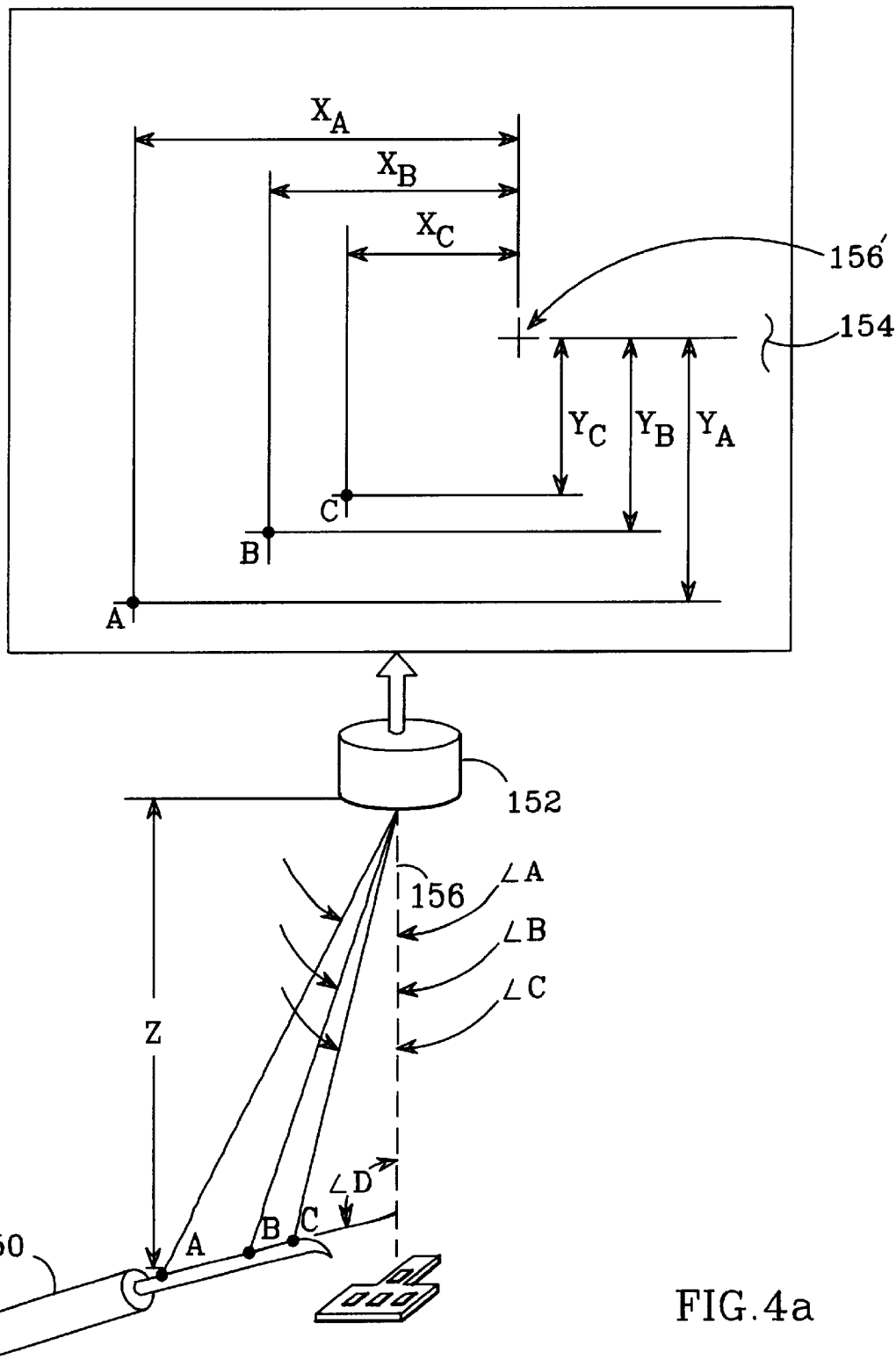

The way in which the coded markings are used to determine probe identity and location is illustrated in FIGS. 4a and 4b. FIG. 4a shows a test probe 150 within the FOV of a camera 152. Coded markings A, B and C are applied to the top of probe 150, and appear in the image 154 conveyed by camera 152. The FOV of camera 152 has a center line 156, and all pattern points are located in reference to the number of pixels X and Y they are from the center line (labeled as 156' in image 154). Thus, markings A, B and C have corresponding pixel addresses $(X_A, Y_A)$, $(X_B, Y_B)$, and $(X_C, Y_C)$, respectively. Once the X,Y coordinates of each marking are known, the angle of each marking relative to the camera centerline is computed, with each angle given by $\tan^{-1}(Y/X)$. The resulting angles are labeled $\angle A$, $\angle B$ and $\angle C$ in FIGS. 4a and 4b.

Next, the angles between the markings are calculated, as follows:

$$\angle AC = \angle A - \angle C$$

$$\angle BC = \angle B - \angle C$$

A ratio R between $\angle AC$ and $\angle BC$ is computed:

$$R = \angle AC / \angle BC$$

The coded markings are preferably arranged such that the R values that result from the above-described calculation are different for each probe; i.e., each probe has a unique ratio.

The ratios for each test probe are known in advance, and are stored in a database in memory device 70. Characteristics associated with the respective probes may also be stored in the database. Once a probe's ratio is determined, the database is searched for a matching ratio. Once a match is found, the identity of the probe is known. The identity of the probe is important in order to control what signals are routed to or from the probe. For example, if the probe is designed for dispensing fluids, its dispensing capabilities are found in the database once the probe is identified; this information can be a factor in determining which probe should be moved into contact with which target feature.

The spatial location of the probes can also be determined from the coded markings. The angle between the system's test probes and the camera's FOV centerline 156 is set by design and adjusted during manufacture, and is thus known. Also known in advance are the actual distances between the markings on each probe, which are stored in the database. A marking's distance relative to camera 152 along the Z-axis is determined based on the actual distance between markings along the probe's length, and two of the measured angles.

The computation breaks down into a series of triangles, as shown in FIG. 4b. Angle $\angle D$ is the known angle between the camera's FOV centerline angle and the probe. Angles $\angle A$, $\angle B$ and $\angle C$ are measured by the camera during operation of the system as described above. Once the probe is identified, the database provides the actual distances between any two probe markings. One of those distances—generally the longest distance in order to enhance accuracy—is chosen for use in the calculation; this distance is identified as X in FIG. 4b.

For the triangle containing angles ∠C and ∠D, its third angle, labeled as ∠E in FIG. 4b, is equal to:

$$\angle E = 180 - \angle D - \angle C$$

This enables an angle (labeled as ∠F) of the adjacent triangle to be determined in accordance with:

$$\angle F = 180 - \angle E$$

Thus, for the triangle formed by ∠A and ∠F, i.e., between points A, C, and the triangles' uppermost point, we know the value of two angles and the length of one side. Given this information, any other side or angle can be computed. Once these other values are computed, the height Z of the triangle is easily computed using well established formulas. The database will also contain exact information as to the relative location of the probe tip from any probe marking used for these computations. Hence, the location of the probe tip in space will become known relative to the camera.

Referring back to FIG. 2, the system's test probes are mechanically linked to one or more mechanisms 100, which operate to move the probes into contact with selected target features. Mechanism 100 is preferably electronically linked to processor 54, which provides signals that direct the mechanism in its movements. It is essential to the invention that each probe be individually movable, instead of having all test probes move simultaneously as is the common practice. It is the invention's ability to identify and select specific target features, and to identify, locate, and move individual probes to selected target features that provide the flexibility and versatility needed to accommodate the testing needs of both prototype and high-volume MEM and IC devices.

Independent mobility may be provided with a single mechanism 100, which includes a number of individually controllable linkages 102, or with a number of separate mechanisms for respective probes. Under the direction of processor 54, mechanism 100 servos a selected test probe as needed to contact a target feature. Given that the camera provides real time images of probe position, a closed loop system can be employed to target a feature to be probed and then to servo the probe to that feature. This could be used for stationary target features, as well as for target features that are moving (in the case of certain MEM devices). Servomechanisms of this sort are well-known.

A complete micro-sized device test system will include test equipment 110, which is used to apply stimuli to and receive inputs from the test probes. Test equipment 110 typically includes a number of parameter application and measurement devices, such as voltage sources and/or voltmeters, pressure sources and/or transducers, etc. Though test equipment 110 is shown as stand-alone, it may also be integrated with PC 56, or may communicate with PC 56 via some type of link 112.

A routing network 114 may be interposed between the test probes 71, 72, 74 and test equipment 110. Such a network would typically include a matrix of switching devices, such as electronic switches and valves, for example, to connect a given probe to a particular piece of test equipment. For example, if both of probes 71 and 72 are intended for the sensing of electronic parameters, and probe 71 is selected to contact the selected target feature, routing network 114 is directed, typically via a command received from processor 54 via a link 116, to connect probe 71 to the appropriate measuring device. The use of such a network further enhances the flexibility of the present invention, as it enables any one of several test probes to probe a selected target feature. For example, whichever probe happens to be closest to a selected target feature can be moved to contact the feature, with the test equipment routed to that probe via the routing network.

Though the invention enables the position of a probe tip along the Z-axis to be determined, Z-axis position information is not essential to the successful positioning of a test probe. For example, the probe tip can be made flexible. If the height of the target feature is known, the probe can be positioned over it in the X-Y plane, and then slowly lowered a distance which will ensure contact with the target feature. If the probe is sufficiently flexible, contact with the target feature will be achieved without damaging either the feature or the probe tip.

It is also possible to receive a positive indication that contact with a target feature has been established. For example, if probing an electrical parameter, the selected probe's contacting of the target feature will complete an electrical circuit. This circuit closure can be detected to indicate that contact has been made. When so detected, the positioning mechanism is commanded to stop lowering the probe.

Figure 5:
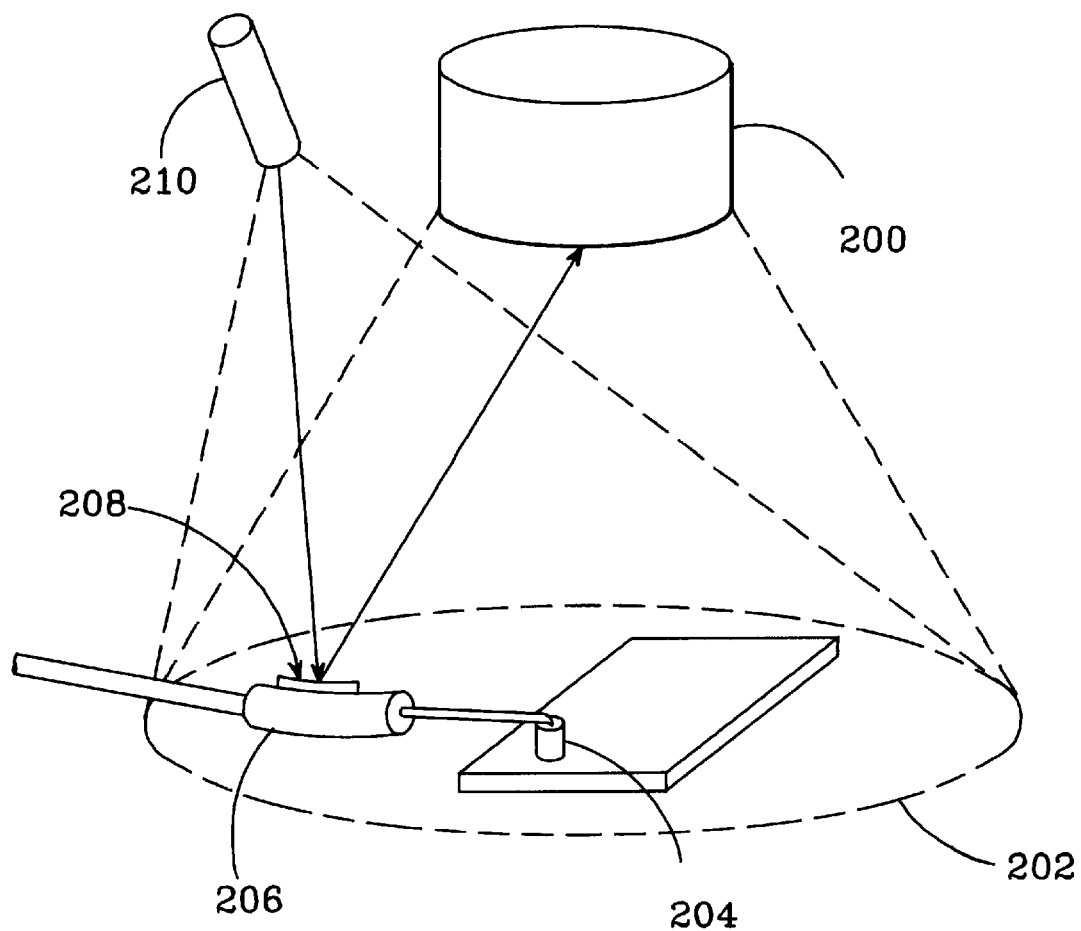
FIG. 5 is a diagram illustrating the use of a polarized coating to indicate when a test probe has contacted a target feature.

Yet another method of detecting that a probe tip has contacted a selected target feature is depicted in FIG. 5. A camera 200 has a field of view 202, which encompasses a target feature 204 and a test probe 206. A thin, polarizing coating 208 is applied to the top of the probe, and a polarized light source 210 is directed onto the coating. The thin coating 208 normally lies in a flat plane, and the coating and light source 210 are arranged so that, when the coating is flat, little to no polarized light is reflected to the camera 200. However, when the tip of probe 206 contacts the target feature 204, the probe—and thus the coating 208—will bend. This causes light from source 210 to be reflected to camera 200. If manually operated, the user sees the reflected light in the image produced by camera 200, informing him that contact with the target feature has occurred. If automatically operated, the processor is programmed to detect and recognize the receipt of the reflected light, and to command the probe-moving mechanism to stop.

The imaging device used by the probe-positioning method and system is preferably a CCD camera, due to its compactness, low-cost, and ability to be operate in very low light. However, any imaging device that can produce an accurate image of the micro-sized device to be tested on a display screen comprised of an array of pixels can be used.

While particular embodiments of the invention have been shown and described, numerous variations and alternate embodiments will occur to those skilled in the art. Accordingly, it is intended that the invention be limited only in terms of the appended claims.

What is claimed is:

1. A method of positioning a test probe on a micro-sized device, comprising the steps of:

displaying an image of a micro-device to be probed on a display screen, selecting a target feature to be probed within said image, said step of selecting a target feature comprising the steps of illuminating said target feature with a spot of laser light and recognizing said laser spot within said image, determining the pixel address of said selected target feature, said address being the target address, introducing a test probe into the field of view of said image, determining the pixel address of said test probe within said image, said address being the probe address, and moving said probe based on said target and probe addresses to cause said probe to contact said selected target feature.

2. The method of claim 1, wherein said step of selecting a target feature further comprises optically filtering the light reflected from the surface of said micro-device to reduce the number of objects visible in said image and thereby aid in recognizing said laser spot.

3. A method of positioning a test probe on a micro-sized device, comprising the steps of:

displaying an image of a micro-device to be probed on a display screen, selecting a target feature to be probed within said image, determining the pixel address of said selected target feature, said address being the target address, selecting and identifying a particular test probe from among a plurality of test probes within said image, determining the pixel address of said selected test probe within said image, said address being the probe address, and moving said probe based on said target and probe addresses to cause said probe to contact said selected target feature.

4. The method of claim 3, wherein said step of selecting a particular test probe comprises manually causing a movable location indicator within said image to be placed on or near the selected test probe.

5. The method of claim 3, wherein each of said plurality of test probes conveys a respective parameter between said micro-sized device and one or more pieces of test equipment, further comprising the step of routing a parameter between said selected test probe and an appropriate piece of test equipment.

6. The method of claim 3, further comprising the step of applying markings to each of said plurality of test probes appearing within said image to aid in said step of identifying a particular test probe.

7. The method of claim 6, wherein said step of marking each of said plurality of test probes comprises applying coded marking patterns to respective test probes, each of said coded marking patterns being distinct from every other of said coded marking patterns.

8. The method of claim 7, wherein each of said coded marking patterns includes at least three markings spaced a known distance apart and a known distance from said probe's tip.

9. The method of claim 8, wherein said step of displaying said image is performed with a camera having a field of view (FOV) about a centerline, said step of identifying a particular test probe further comprising the steps of:

determining the pixel addresses for each of said at least three markings on said selected probe, computing the relative angles between each of said at least three markings on said selected probe and said centerline, computing the relative angles between each of said at least three markings on said selected probe, calculating the ratio between two of said relative angles between each of said at least three markings on said selected probe, and searching a database of ratios that have been previously determined for each of said plurality of test probes for a matching ratio, said matching ratio in said database identifying said selected probe.

10. The method of claim 9, further comprising the step of determining the position of said selected probe relative to said camera, comprising the steps of:

determining the relative angle between said centerline and said selected probe, and calculating the Z-axis distance between one of said at least three markings on said selected probe and said camera based on the relative angle between said centerline and said selected probe, the relative angles between each of said at least three markings on said selected probe and said centerline, and said known distances between said markings.

11. The method of claim 7, wherein said coded marking patterns are applied with fluorescent paint to aid in said step of identifying a particular test probe from among a plurality of test probes.

12. The method of claim 11, wherein the coded marking patterns on different ones of said plurality of probes are applied with fluorescent paints that fluoresce at different light wavelengths such that the markings on individual probes can be made to fluoresce selectively.

13. The method of claim 7, further comprising the step of illuminating said micro-device with laser light.

14. The method of claim 6, wherein said step of identifying a particular test probe from among a plurality of test probes appearing within said image further comprises optically filtering the light reflected from said test probes to reduce the number of objects visible in said image and thereby aid in identifying said particular test probe.

15. The method of claim 6, wherein said step of applying markings to each of said plurality of test probes comprises the steps of attaching scored optical fibers to respective test probes and of providing a source of light to each of said scored optical fibers.

16. The method of claim 15, wherein the scoring of each of said scored optical fibers is distinct from the scoring of every other of said scored optical fibers.

17. The method of claim 15, wherein optical energy can be independently coupled to each of said scored optical fibers, the step of identifying a particular test probe from among a plurality of test probes further comprising the step of providing optical energy to the fiber on said selected test probe only to reduce the number of objects visible in said image and thereby aid in identifying said particular test probe.

18. The method of claim 15, wherein optical energy can be independently coupled to each of said scored optical fibers at respective unique wavelengths, the step of identifying a particular test probe from among a plurality of test probes further comprising the step of optically filtering the light emitted from said test probes to reduce the number of objects visible in said image and thereby aid in identifying said particular test probe.

19. A method of positioning a test probe on a micro-sized device, comprising the steps of:

displaying an image of a micro-device to be probed on a display screen, selecting a target feature to be probed within said image, determining the pixel address of said selected target feature, said address being the target address, introducing a test probe into the field of view of said image, applying a thin, polarized coating to said probe and illuminating said coating with a polarizing light source, determining the pixel address of said test probe within said image, said address being the probe address, moving said probe based on said target and probe addresses to cause said probe to contact said selected target feature, detecting when said probe contacts said selected target feature, said step of detecting when said probe contacts said target feature comprising detecting when said polarized light is reflected from said coating and appears in said image, said reflected polarized light indicating that said probe is bending and thereby is in contact with said selected target feature.

20. A method of positioning a test probe on a target feature of a micro-sized device, comprising the steps of:

displaying an image of a micro-device to be probed on a display screen, manually selecting a target feature to be probed within said image, determining the pixel address of said selected target feature, said address being the target address, introducing one or more test probes into the field of view of said image, applying coded markings to each of said one or more test probes appearing within said image, manually selecting a particular test probe from among said one or more test probes within said image, said selected probe identified by reference to said coded markings, determining the pixel address of said selected test probe within said image, said address being the probe address, and moving said probe based on said target and probe addresses to cause said probe to contact said selected target feature.

21. A method of automatically positioning a test probe on a target feature of a micro-sized device, comprising the steps of:

displaying an image of a micro-device to be probed on a display screen, processing said image to identify a target feature to be probed within said image, determining the pixel address of said target feature, said address being the target address, introducing one or more test probes into the field of view of said image, automatically identifying a particular test probe from among said one or more test probes appearing within said image, automatically determining the pixel address of said identified test probe within said image, said address being the probe address, and automatically moving said probe based on said target and probe addresses to cause said probe to contact said selected target feature.

22. The method of claim 21, wherein said step of processing said image to identify a target feature to be probed within said image comprises the steps of storing information regarding said device's target features in a database, and of searching for and recognizing said identified target feature within said image using said database information.

23. The method of claim 21, wherein said steps of processing said image to identify a target feature, determining said target address, automatically identifying a particular test probe, automatically determining said probe address, and automatically moving said identified probe to cause said probe to contact said selected target feature are accomplished with a programmed processor connected between said display screen and a mechanism arranged to move said identified probe under the direction of said processor.

24. The method of claim 21, wherein said step of automatically identifying a particular test probe comprises the steps of applying respective unique patterns of coded markings to each of said test probes appearing within said image, storing information about each test probe's identity and its respective pattern of markings in a database, and of comparing a probe's observed pattern of markings with said stored information to find a matching pattern.

25. A test probe positioning system for probing one or more target features of a micro-sized device, comprising:

a display screen, an imaging device connected to convey the image of a micro-sized device within its field of view (FOV) to said display screen, a first selection means by which a target. feature within said image of said micro-sized device is selected, a processor connected to said imaging device and said selection means and programmed to determine the pixel address of said selected target feature within said image, said address being the target address, at least one test probe to which coded markings have been applied that are detectable by said imaging device when in its field of view, a second selection means by which a particular one of said at least one test probes within said FOV is selected, said processor programmed to determine the pixel address of said selected test probe within said image and to detect and use said coded markings to determine the identity of said selected test probe, said pixel address being the probe address, and a mechanism mechanically linked to said selected probe and arranged to move said probe in response to a signal received from said processor, said processor programmed to provide said signal to said mechanism to bring said selected probe into contact with said selected target feature.

26. The test probe positioning system of claim 25, wherein said imaging device is a charge-coupled device (CCD) camera.

27. The test probe positioning system of claim 25, wherein said first selection means comprises a movable location indicator within said image, said processor programmed to determine the pixel address of said indicator upon receipt of an indication that said indicator is on or near a target feature to be selected, the pixel address of said indicator being said target address.

28. The test probe positioning system of claim 27, further comprising a computer mouse connected to said processor, said processor programmed to move said indicator about said image as said mouse is moved.

29. The test probe positioning system of claim 25, further comprising a data storage means, said data storage means storing a database of information on one of more of said target features, said first selection means comprising said processor programmed to use said database information to search and recognize a particular target feature within said image and to determine the pixel address of said target feature when found and recognized, said pixel address being said target address.

30. The test probe positioning system of claim 25, each of said test probes within said FOV having a pattern of coded markings applied to it which is distinct from every other of said patterns, said processor programmed to identify said selected probe based on said coded markings.

31. The test probe positioning system of claim 30, wherein each of said coded marking patterns includes at least three markings spaced a known distance apart and a known distance from said probe's tip.

32. The test probe positioning system of claim 31, wherein said processor is arranged to identify said selected test probe based on its pattern of coded markings, said processor programmed to:
  determine the pixel addresses for each of said at least three markings on said selected probe,
  compute the relative angles between each of said at least three markings on said selected probe and said centerline,
  compute the relative angles between each of said at least three markings on said selected probe,
  calculate the ratio between two of said relative angles between each of said at least three markings on said selected probe, and
  search a database of ratios that have been previously determined for the marking patterns on each of said test probes within said FOV for a matching ratio, said matching ratio in said database identifying said selected probe.

33. The test probe positioning system of claim 32, wherein said processor is further arranged to determine the position of said selected probe relative to said camera, said processor programmed to:
  determine the relative angle between said centerline and said selected probe, and
  calculate the Z-axis distance between one of said at least three markings on said selected probe and said camera based on the relative angle between said centerline and said selected probe, the relative angles between each of said at least three markings on said selected probe and said centerline, and said known distances between said markings.

34. The test probe positioning system of claim 30, wherein said coded markings are applied with fluorescent paint to aid in the identification of said probe.

35. The test probe positioning system of claim 34, wherein the fluorescent paint applied on different ones of said probes fluoresces at different light wavelengths such that the markings on individual probes can be made to fluoresce selectively.

36. The test probe positioning system of claim 25, wherein said coded markings comprise scored optical fibers attached to respective test probes, the scoring of each of said scored optical fibers being distinct from the scoring of every other of said scored optical fibers, said processor programmed to identify said selected probe based on said scoring, further comprising a source of light coupled to supply light to each of said scored optical fibers.

37. The test probe positioning system of claim 25, wherein said coded markings comprise scored optical fibers attached to respective test probes, further comprising a plurality of light sources coupled to supply light to respective fibers such that optical energy is supplied to each fiber independently.

38. The test probe positioning system of claim 25, wherein said coded markings comprise scored optical fibers attached to respective test probes, further comprising a plurality of light sources coupled to supply light to respective fibers such that optical energy is supplied to said fibers at respective wavelengths, each of said wavelengths being different to aid in the identification of said probe.

39. The test probe positioning system of claim 25, further comprising a pointable laser light source for illuminating said selected target feature to aid in the selection of said target feature.

40. The test probe positioning system of claim 25, further comprising an optical filter positioned to filter light from said micro-sized device to aid in the selection of said target feature.

41. The test probe positioning system of claim 25, further comprising one or more optical filters, each of said filters capable of being independently moved between said micro-sized device and said imaging device to filter light received by said imaging device.

42. The test probe positioning system of claim 25, wherein said second selection means comprises a movable location indicator within said image, said processor programmed to determine the pixel address of said indicator upon receipt of an indication that said indicator is on or near the test probe to be selected, said address being said probe address.

43. The test probe positioning system of claim 25, wherein said display screen, said processor, said first selection means and said second selection means comprise components of a personal computer.

44. The test probe positioning system of claim 25, wherein said micro-sized device is a micro-electromechanical (MEM) device.

45. The test probe positioning system of claim 44, wherein said test probe applies or senses an electrical, mechanical, fluidic, acoustic, or pneumatic parameter of said MEM device.

46. The test probe positioning system of claim 25, wherein said micro-sized device is an integrated circuit (IC).

47. The test probe positioning system of claim 25, further comprising a means of detecting when said selected probe has contacted said selected target feature, said processor arranged to stop the movement of said selected probed when said contact is detected.

48. The test probe positioning system of claim 47, wherein said means of detecting when said selected probe has contacted said selected target feature comprises circuitry arranged to sense when a circuit which includes said selected probe is completed, said circuit completed when said selected probe is in contact with said selected target feature.

49. The test probe positioning system of claim 47, wherein said means of detecting when said selected probe has contacted said selected target feature comprises a thin, polarized coating on each of said probes within said FOV and a polarizing light source directed to illuminate said coatings, said coatings and said polarized light source arranged such that said polarized light is reflected into said imaging device when said probe is bending, said probe bending when it is in contact with said selected target feature.

50. The test probe positioning system of claim 25, wherein said at least one test probe comprises a plurality of probes, said system further comprising a routing network and test equipment, said routing network interposed between said plurality of probes and said test equipment, said routing network arranged to route a parameter between said selected test probe and an appropriate piece of test equipment.

51. The test probe positioning system of claim 50, wherein said routing network comprises a matrix of switching devices, said network controlled by said processor.

52. The test probe positioning system of claim 31, wherein said processor is programmed to identify the test probe which is closest to said selected target feature and to control said routing network such that said closest probe is connected to an appropriate piece of test equipment.

* * * * *